United States Patent
Wang

(10) Patent No.: US 10,628,031 B2
(45) Date of Patent: Apr. 21, 2020

(54) CONTROL INSTRUCTION IDENTIFICATION METHOD AND APPARATUS, AND STORAGE MEDIUM

(71) Applicant: ZTE CORPORATION, Shenzhen, Guangdong (CN)

(72) Inventor: Haowen Wang, Shenzhen (CN)

(73) Assignee: ZTE CORPORATION, Shenzhen, Guangdong (CN)

( * ) Notice: Subject to any disclaimer, the term of this patent is extended or adjusted under 35 U.S.C. 154(b) by 0 days.

(21) Appl. No.: 16/090,321

(22) PCT Filed: Jun. 22, 2016

(86) PCT No.: PCT/CN2016/086775
§ 371 (c)(1),
(2) Date: Oct. 1, 2018

(87) PCT Pub. No.: WO2017/166455
PCT Pub. Date: Oct. 5, 2017

(65) Prior Publication Data
US 2019/0114069 A1    Apr. 18, 2019

(30) Foreign Application Priority Data
Mar. 29, 2016    (CN) .......................... 2016 1 0189035

(51) Int. Cl.
*G06F 3/0488*    (2013.01)
*G06F 3/041*    (2006.01)
(Continued)

(52) U.S. Cl.
CPC ........ *G06F 3/04883* (2013.01); *G06F 3/0414* (2013.01); *G06F 3/0485* (2013.01); *G06F 3/0488* (2013.01); *H03K 17/96* (2013.01)

(58) Field of Classification Search
None
See application file for complete search history.

(56) References Cited

U.S. PATENT DOCUMENTS 9,030,419 B1   5/2015   Freed
9,244,562 B1   1/2016   Rosenberg et al.
(Continued)

FOREIGN PATENT DOCUMENTS

CN    104199604 A    12/2014
CN    104834456 A    8/2015
(Continued)

OTHER PUBLICATIONS

English machine translation of Chinese patent publication CN105389119A. (Year: 2016).*
(Continued)

*Primary Examiner* — Nicholas J Lee
(74) *Attorney, Agent, or Firm* — Foley & Lardner LLP

(57) ABSTRACT

Provided are a control instruction identification method and apparatus, and a storage medium. The method includes: detecting a first touch event executed on a touch screen, where the first touch event is used for indicating a touch position and a pressing pressure value when a touch operation is performed on the touch screen; converting the first touch event into a direction input event according to a predetermined policy; and identifying a control instruction according to the direction input event. The control instruction corresponds to the first touch event and is to be executed on the touch screen.

16 Claims, 3 Drawing Sheets

(51) Int. Cl.
*G06F 3/0485* (2013.01)
*H03K 17/96* (2006.01)

(56) References Cited

U.S. PATENT DOCUMENTS

| | | | |
|---|---|---|---|
| 2009/0153495 A1 | 6/2009 | Chen et al. | |
| 2011/0242042 A1 | 10/2011 | Xu | |
| 2011/0276879 A1* | 11/2011 | Ando | G06F 3/0488 |
| | | | 715/702 |
| 2014/0258923 A1 | 9/2014 | Kim et al. | |
| 2016/0077631 A1* | 3/2016 | Yamamoto | G06F 3/044 |
| | | | 345/174 |

FOREIGN PATENT DOCUMENTS

| | | |
|---|---|---|
| CN | 105224198 A | 1/2016 |
| CN | 105389119 A | 3/2016 |
| EP | 2 267 585 A2 | 12/2010 |

OTHER PUBLICATIONS

International Search Report for International Appl. No. PCT/CN2016/086775, dated Dec. 29, 2016.
European Search Report for EP Appl. No. 16896228.0, dated Oct. 8, 2019.

* cited by examiner

CONTROL INSTRUCTION IDENTIFICATION METHOD AND APPARATUS, AND STORAGE MEDIUM

CROSS-REFERENCE TO RELATED APPLICATIONS

This is a National Stage Application, filed under 35 U.S.C. 371 of International Patent Application No. PCT/CN2016/086775, filed on Jun. 22, 2016, which claims priority to Chinese Patent Application No. 201610189035.3 filed on Mar. 29, 2016, the contents of both of which are incorporated herein by reference in their entireties.

TECHNICAL FIELD

The present disclosure relates to the communications field, and in particular, to a control instruction identification method and apparatus, and a storage medium.

BACKGROUND

After the touch screen technology is widely applied in mobile terminals, the original direction keys are cancelled at the same time with the keyboard. However, in fact, the direction key still has a wide range of application requirements, such as in the fields of simulation games, page-turning for reading long text, large picture browsing, cross-region focus switching, and cursor control during text editing. However, in the related art, when a direction input is simulated on a touch screen of a mobile terminal, it is necessary to set a limited range in the touch sensing region of the device for presenting direction control keys. When a touch event occurs, a region (for example, a defined region in which an upward direction key is displayed) in which the touched coordinate point is located is detected. Finally the type of the generated simulation signal is determined. The screen region of the touch screen device within the simulation signal identification region has a single function for only detecting directions.

A disadvantage of the above-mentioned solution is that, the touch screen and display device within a direction detection region may no longer be used for other operations. Moreover, with the continuous development of the touch screen terminal, the touch screen and the display screen have been completely coincided. In order to identify the direction detection region, an illustrated silkscreen or virtual direction key covers the display region of the screen. Therefore, the disadvantages of this method are mainly as follows: first, the displayed virtual key reduces the touch screen area available for other operations, which brings great inconvenience to the human-computer interaction arrangement; second, the virtual key occupies the display area of valid data, so that a part of the limited screen space is required to display virtual direction keys. In addition, this method may only simulate simple direction keys, and is unable to identify more user intents, so that the application scope and user experience are limited.

No efficient solution has been provided to solve the problem in the related art that the method for identifying the control instruction on the touch screen is limited.

SUMMARY

The present disclosure provides a control instruction identification method and apparatus, which enriches methods for identifying the control instruction on the touch screen.

The present disclosure provides a control instruction identification method. The method includes: detecting a first touch event executed on a touch screen, where the first touch event is used for indicating a touch position and a pressing pressure value when a touch operation is performed on the touch screen; converting the first touch event into a direction input event according to a predetermined policy; and identifying a control instruction according to the direction input event, where the control instruction corresponds to the first touch event and is to be executed on the touch screen.

Optionally, before converting the first touch event into a direction input event according to a predetermined policy, the control instruction identification method further includes: acquiring a positional relationship between the touch position of the first touch event and a preset origin position; acquiring a region in which the touch position of the first touch event is located, where the region includes at least one of: an identification region, a non-identification region or a lock screen region; and determining the predetermined policy according to the positional relationship and the region.

Optionally, the determining the predetermined policy according to the positional relationship and the region includes: when the region in which the touch position of the first touch event is located is the identification region, determining the predetermined policy to be a default policy. The default policy includes a direction policy and/or a pressure policy. The direction policy is used for setting a direction parameter for the first touch event and the pressure policy is used for setting a pressure parameter for the first touch event.

Optionally, the converting the first touch event into a direction input event according to a predetermined policy includes: setting the direction parameter for the first touch event according to the direction policy; setting the pressure parameter for the first touch event according to the pressure policy; and converting the first touch event into the direction input event according to the direction parameter and the pressure parameter.

Optionally, the setting the direction parameter for the first touch event according to the direction policy includes: acquiring a direction of the touch position relative to the preset origin position; and setting a direction indication parameter corresponding to the direction as the direction parameter of the first touch event. The direction indication parameter includes at least one of: a slope of the touch position relative to the preset origin position, an included angle between an X-axis direction and a line connecting the touch position and the preset origin position, or a preset direction parameter.

Optionally, the setting the pressure parameter for the first touch event according to the pressure policy includes: acquiring a ratio of the pressing pressure value of the first touch event to a preset pressure value; and setting the ratio as the pressure parameter.

Optionally, the converting the first touch event into the direction input event according to the direction parameter and the pressure parameter includes: storing the direction parameter and the pressure parameter as the direction input event into a first preset storage region according to a first predetermined format. The first preset storage region is used for storing the direction input event and the control instruction corresponding to the direction input event.

Optionally, the determining the predetermined policy according to the positional relationship and the region includes: when the region in which the touch position of the first touch event is located is the non-identification region, determining whether a second touch event is detected simultaneously with the first touch event, where a touch position of the second touch event is located in the identification region; and when determining that the second touch event is detected simultaneously with the first touch event, determining the predetermined policy to be a combination policy which is used for combining the first touch event and the second touch event.

Optionally, the converting the first touch event into a direction input event according to a predetermined policy includes: generating a combination identifier for the first touch event and the second touch event; and storing the first touch event, the second touch event and the combination identifier as the direction input event into a second preset storage region according to a second predetermined format. The second preset storage region is used for storing the direction input event and the control instruction corresponding to the direction input event.

Optionally, the detecting a first touch event executed on a touch screen includes: detecting whether a third touch event is executed on the touch screen, and detecting the first touch event executed on the touch screen in response to the detection of the third touch event. A pressing pressure value of the third touch event is greater than a first predetermined threshold, the pressing pressure value of the first touch event is greater than a second predetermined threshold, and the second predetermined threshold is less than the first predetermined threshold.

Optionally, the detecting the first touch event executed on the touch screen in response to the detection of the third touch event includes: within a predetermined period of time from when the third touch event is detected, detecting the first touch event executed on the touch screen; or during a process of executing a touch operation on the touch screen in response to the third touch event being detected, detecting the first touch event executed on the touch screen.

Optionally, the determining the predetermined policy according to the positional relationship and the region includes: when the region in which the touch position of the first touch event is located is the lock screen region, detecting whether a fourth touch event is executed on the touch screen in the lock screen region; in response to the detection of the fourth touch event, acquiring a current number of detected touch events; and when the number of touch events exceeds a first predetermined number threshold, setting the predetermined policy as an exit policy. The exit policy is used for indicating not to execute the step of converting the first touch event into a direction input event according to a predetermined policy.

The present disclosure further provides a control instruction identification apparatus. The apparatus includes: a detection module, which is configured to detect a first touch event executed on a touch screen, where the first touch event is used for indicating a touch position and a pressing pressure value when a touch operation is performed on the touch screen; a conversion module, which is configured to convert the first touch event into a direction input event according to a predetermined policy; and an identification module, which is configured to identify a control instruction according to the direction input event. The control instruction corresponds to the first touch event and is to be executed on the touch screen.

The present disclosure further provides a non-volatile storage medium which is configured to store computer-executable instructions for executing any control instruction identification method described above.

The present disclosure further provides a control instruction identification device. The device includes:
one or more processors;
a memory; and
one or more programs stored in the memory. When executed by the one or more processors, the one or more programs execute any one of above-mentioned operations in the control instruction identification method.

According to the present disclosure, a touch position and a pressing pressure value of a detected first touch event into the direction input event are converted according to a predetermined policy to a direction input event, and a corresponding control instruction is acquired according to the direction input event to control the touch screen. Different control instructions are set for different direction input events in advance according to different application scenarios. Therefore, when the direction input event is received again, the corresponding control instruction is identified according to different scenarios. The combination of the touch position and the pressing pressure value may further provide more manners of identifying control instructions, so that more user intents may be identified through the control instructions on the touch screen, such that the identification of the control instruction on the touch screen according to the touch position and the pressing pressure value is achieved, thereby strengthening the identification of control intents on the touch screen and enriching the manner of identifying the control instruction on the touch screen.

DETAILED DESCRIPTION

The present disclosure will be described hereinafter in detail through embodiments with reference to the accompanying drawings. It is to be noted that if not in collision, the embodiments and features therein in the present disclosure may be combined with each other.

It is to be noted that the terms "first", "second" and the like in the description, claims and above accompanying drawings of the present disclosure are used to distinguish between similar objects and are not necessarily used to describe a particular order or sequence.

First Embodiment

Figure 1:
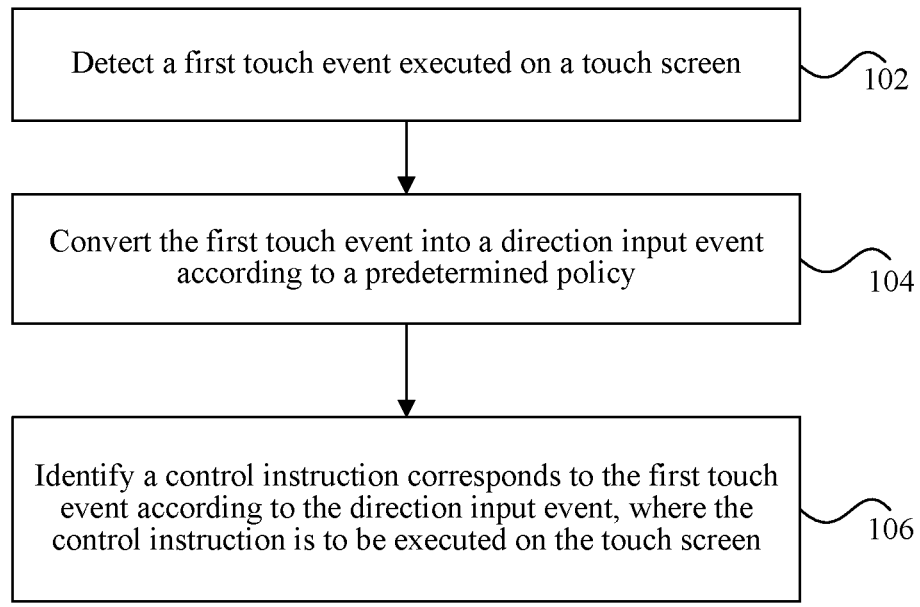
FIG. 1 is a flowchart of an optional control instruction identification method according to an embodiment of the present disclosure.

The present embodiment provides a control instruction identification method. FIG. 1 is a flowchart of an optional control instruction identification method according to an embodiment of the present disclosure. As shown in FIG. 1, the control instruction identification method includes the steps described below.

In step 102, a first touch event executed on a touch screen is detected. The first touch event is used for indicating a touch position and a pressing pressure value when a touch operation is performed on the touch screen.

In step 104, the first touch event is converted into a direction input event according to a predetermined policy.

In step 106, a control instruction is identified according to the direction input event. The control instruction corresponds to the first touch event and is to be executed on the touch screen.

Optionally, the present embodiment may, but is not limited to, be applied to a scenario for identifying the control instruction on the touch screen, especially in a scenario in which the control instruction on the touch screen of a terminal is identified in conjunction with operation directions on a touch control screen of the touch screen, such as the movement of a text input position in a text input scenario, the control of the way, number and position of selection in a text selection scenario, the direction control of an operation target in a game scenario and the control of the current display content in a web browsing scenario.

The touch position and the pressing pressure value of the detected first touch event are converted into the direction input event according to the predetermined policy, the corresponding control instruction according to the direction input event is acquired, and the touch screen is controlled according to the control instruction. Different control instructions are set for the direction input event according to different usage scenarios in advance, so that when the direction input event is received again, the corresponding control instruction is identified according to different scenarios. The combination of the touch position and the pressing pressure value may also provide more manners of setting and identifying the control instruction, so that more user intents may be identified by the direction control on the touch screen, thereby implementing the identification of the control instruction on the touch screen according to the touch position and the pressing pressure value, strengthening the identification of user control intents on the touch screen and enriching the manner of identifying the control instruction on the touch screen.

Optionally, the predetermined policy may, but is not limited to, be determined according to features of the first touch event. More manners are provided for the generation of the direction input event by setting different predetermined policies for different features of the first touch event, so as to provide more control instructions for the touch operation, thereby identifying more control intents on the touch screen.

An embodiment is described below to illustrate the process of determining the corresponding predetermined policy according to features of the first touch event.

In the present embodiment, before the above-mentioned step 104, a preset origin may be acquired on the screen, the screen is divided into multiple regions according to a certain rule with the preset origin as a center, and the predetermined policy is determined according to a positional relationship between the first touch event and the preset origin and the region in which the first touch event is located on the screen. By determining a conversion policy of the first touch event according to different regions, the manner of identifying the control instruction is increased, the identification of the control intents on the touch screen is enhanced, the manner of identifying the control instruction on the touch screen is enriched, and the user experience is improved.

In the present embodiment, the touch screen may be divided into the following regions: an identification region, a non-identification region and a lock screen region. For example, taking a center point, whose coordinate is (X0, Y0), of the touch screen as the preset origin, the screen is divided into the following three regions according to distances between points on the screen and the preset origin: a region the point in which has a distance from the preset origin greater than a first preset value A1 and less than a second preset value A2 is set as the identification region; a region the point in which has a distance from the preset origin is greater than the second preset value A2 is set as the non-identification region; and a region the point in which has a distance from the preset origin is less than the first preset value A1 is set as the lock screen region. When the first touch event having a coordinate (X1, Y1), is detected and the distance between the first touch event and the preset origin is A, where A1<A<A2, it is determined that the first touch event is located in the identification region. At the moment, the predetermined policy of the first touch event is determined according to a relationship between (X1, Y1) and (X0, Y0) as well as a rule corresponding to the identification region. The first preset value A1 may be set as 0 and the second preset value A2 may be set as a value greater than a size of the touch screen. It is to be noted that the above-mentioned three divided regions are merely examples to illustrate the present disclosure and are not intended to limit the region division manner of the touch screen for determining the predetermined policy.

Three examples are described below to illustrate the manner of determining the predetermined policy when the touch position of the first touch event is located in the above different regions.

In the first example, described is the manner of determining the predetermined policy when the touch position of the first touch event is located in the identification region.

When the touch position of the first touch event is located in the identification region, the predetermined policy is determined to be a default policy. The default policy may include a direction policy used for setting a direction parameter for the first touch event and/or a pressure policy used for setting a pressure parameter for the first touch event. It is to be noted that the default policy are limited to the direction policy and the pressure policy. The default policy may also be a policy for setting other parameters of the first touch event. The embodiments of the present disclosure merely take the direction policy and the pressure policy as an example.

In the first example, after the predetermined policy is determined to be the default policy, the direction parameter is set for the first touch event according to the direction policy, the pressure parameter is set for the first touch event according to the pressure policy, and the first touch event is converted into the direction input event according to the direction parameter and the pressure parameter.

When the direction parameter is set for the first touch event according to the direction policy, a direction of the touch position relative to the preset origin may be first acquired, and then a direction indication parameter corresponding to the direction is set as the direction parameter of the first touch event.

In the first example, the direction indication parameter may be a slope of the touch position relative to the preset origin, an included angle between a line connecting the touch position and the preset origin position and an X-axis direction, or a preset direction parameter. The pressure parameter may be a ratio of the pressing pressure value of the first touch event to a preset pressure value. The pressure parameter is used for representing the range and the degree of the control operation performed according to the control instruction.

After the direction parameter and the pressure parameter are acquired for the first touch event according to the default policy, the direction parameter and the pressure parameter may be stored as the direction input event into a first preset storage region according to a first predetermined format. The first preset storage region is used for storing the direction input event and the control instruction corresponding to the direction input event. That is, the direction parameter and the pressure parameter of the first touch event, as the direction input event, as well as control instructions corresponding to these two parameters, are stored into a designated storage region for use by an application program.

Through the above-mentioned steps, when the first touch event is located in the identification region, the direction parameter and the pressure parameter are set for the first touch event according to the positional relationship between the first touch event and the preset origin, the direction parameter and the pressure parameter of the first touch event are stored as the direction input event into the first preset storage region according to the first preset format, the direction input event may be used by the application program, and a control instruction corresponding to the direction input event in the application program is acquired according to the direction parameter and the pressure parameter so as to control the touch screen. It can be seen that through the above-mentioned steps, the control instructions may be set for the direction input event according to requirements of different application programs. In addition, the setting forms and the using forms of the control instruction may also be enriched with the combination of the direction parameter and the pressure parameter.

In the second example, described is a manner of determining the predetermined policy when the touch position of the first touch event is located in the non-identification region.

In the second example, when the touch position of the first touch event is located in the non-identification region, if a second touch event whose touch position is located in the identification region is detected at the same time, the predetermined policy is determined to be a combination policy which combines the first touch event and the second touch event. In the combination policy, first, a combination identifier for indicating a relationship between the first touch event and the second touch event may be generated for the first touch event and the second touch event. For example, the combination identifier may be used for indicating that the first touch event and the second touch event are detected at the same time. Next, according to a second predetermined format, the first touch event, the second touch event and the combination identifier are stored as the direction input event into a second preset storage region which is used for storing the direction input event and the control instruction corresponding to the direction input event.

Through the above-mentioned steps, when a touch event in the identification region and a touch event in the non-identification region are detected simultaneously, the first touch event detected in the non-identification region is retained, a relationship between the first touch event and the second touch event detected in the identification region is created, and the two touch events as a combination are converted into the direction input event. When an application program is used according to the direction input event, a direction of the screen may be controlled according to the touch event in the identification region, other instructions may be executed according to the touch event in the identification region. Touch event in the non-identification region which may be discarded may be used, so that control intents expressed through the touch screen are enriched and more manners of identifying the control instruction are provided.

In the above-mentioned step 102, whether a third touch event whose pressing pressure value is greater than a first predetermined threshold is executed on the touch screen may be first detected, and when the third touch event is found, the first touch event executed on the touch screen is detected. In the present embodiment, the pressing pressure value of the third touch event is greater than the first predetermined threshold, the pressing pressure value of the first touch event is greater than a second predetermined threshold and the first predetermined threshold is greater than the second predetermined threshold. That is, after the third touch screen whose pressing pressure value is greater than a relatively large threshold is detected, the requirement for the pressing pressure value of the first touch event may be decreased to be a relatively small threshold. In such way, more touch events may be identified as the first touch event and be converted into the direction input events, so that user operations that can be converted are increased and the manner of identifying the control instruction on the touch screen is enriched.

In the present embodiment, the preset origin may be set in advance, or acquired through identifying a touch operation, for example, the third touch event may be identified as the preset origin.

When the third touch event is detected, the time for detecting whether the first touch event is executed after the third touch event is found may be limited by setting a timer. That is, within a predetermined time from the time when the third touch event is detected, it is detected whether the first touch event is executed on the touch screen. Alternatively, whether to detect the first touch event may be determined by detecting whether continuous touch operations on the touch screen exist. For example, during the process that the touch operation is performed on the touch screen from the time when the third touch event is detected, the first touch event executed on the touch screen is detected. Through the above-mentioned steps, a limit condition may be set for detecting the first touch event, so that the manner of identifying the control instruction is enriched.

In the third example, described is a manner of determining the predetermined policy when the touch position of the first touch event is located in the lock screen region.

In the third example, when the touch position of the first touch event is located in the lock screen region, whether a fourth touch event is executed in the lock screen region of the touch screen may be detected. When the fourth touch event is detected, the number of touch events currently detected is acquired. When the number of touch events exceeds a first number predetermined threshold, the predetermined policy is set as an exit policy used for indicating not to execute the step of converting the first touch event into a direction input event according to a predetermined policy.

In the present non-limiting embodiment, the first touch event is detected when a system is in a simulation input state, and the detected first touch event is converted into a direction input event corresponding to the control instruction according to the predetermined policy. In order to keep the system in the simulation input state, a timer may be set and the first touch event detected within a specified period of time of the timer is used for the identification of the control instruction, or the touch operation on the touch screen may be maintained and the first touch event whose pressing pressure value satisfy a condition in the process of the touch operation is used for the identification of the control instruction.

In addition, when the first touch event is located in the lock screen region, the system is in a lock screen state. In this state, the system is locked in the simulation input state, that is, the system is kept in the simulation input state. The lock screen state and/or the simulation input state may be exited through a triggering a preset number of touch events in the lock screen region.

Optionally, the predetermined policy may be determined through the following steps. First, the positional relationship between the touch position of the first touch event and the preset origin as well as the region of the touch screen in which the touch position of the first touch event is located are acquired. Next, the screen is divided into the following regions: the identification region, the non-identification region and the lock screen region. The predetermined policy is determined according to the positional relationship between the first touch event and the preset origin as well as the region of the touch screen in which the first touch event is located.

For example, taking the center point, whose coordinate is (X0, Y0), of the touch screen as the preset origin, the screen is divided into the following three regions according to distances between points on the screen and the preset origin. A region the point in which has a distance from the preset origin greater than the first preset value A1 and less than the second preset value A2 is set as the identification region. A region the point in which has a distance from the preset origin greater than the second preset value A2 is set as the non-identification region. A region the point in which has a distance less than the first preset value A1 is set as the lock screen region. When the first touch event, whose coordinate is (X1, Y1), is detected and the distance between the first touch event and the preset origin is A, where A1<A<A2, it is determined that the first touch event is located in the identification region. At the moment, the predetermined policy of the first touch event is determined according to the relationship between (X1, Y1) and (X0, Y0) as well as a rule corresponding to the identification region.

It is to be noted that the first preset value may be set as 0 and the second preset value may be set as a value greater than the size of the touch screen.

Optionally, when the touch position of the first touch event is located is the identification region, the predetermined policy is determined to be a default policy. The default policy includes the direction policy and/or the pressure policy, the direction policy is used for setting the direction parameter for the first touch event and the pressure policy is used for setting the pressure parameter for the first touch event.

Optionally, the direction parameter may be set for the first touch event according to the direction policy, the pressure parameter may be set for the first touch event according to the pressure policy, and the first touch event is converted into the direction input event in a manner of converting the first touch event into the direction input event according to the direction parameter and the pressure parameter.

Optionally, when the direction parameter is set, a direction of the touch position relative to the preset origin is acquired, and a direction indication parameter corresponding to the direction is set as the direction parameter of the first touch event, where the direction indication parameter includes at least one of: a slope of the touch position relative to the preset origin, an included angle between a line connecting the touch position and the preset origin and an X-axis direction and a preset direction parameter.

For example, when the direction indication parameter is the slope of the touch position relative to the preset origin, the slope may be calculated according to a coordinate of the first touch event and a coordinate of the preset origin. When the direction indication parameter is the included angle between the line connecting the touch position and the preset origin and the X-axis direction, the included angle may be calculated according to a ratio of a X-axis offset value of the position of the first touch event relative to the preset origin to the distance between the position of the first touch event and the preset origin.

Optionally, setting the pressure parameter for the first touch event according to the pressure policy is implemented by acquiring a ratio of the pressing pressure value of the first touch event to a preset pressure value and setting the ratio as the pressure parameter. The pressure parameter is used for representing the range of and degree of the control operation executed based on the control instruction. For example, in the text selection operation, the larger the pressure parameter is, the more words the minimum selection unit includes. In one example, in the text selection operation, a first pressure parameter may correspond to selecting one word at a time and a second pressure parameter may correspond to selecting a line of words at a time, where the first pressure parameter is less than the second pressure parameter.

Optionally, after the direction parameter and the pressure parameter are set for the first touch event, the direction parameter and the pressure parameter may be stored, according to the first predetermined format and as the direction input event, into the first preset storage region which is used for storing the direction input event and the control instruction corresponding to the direction input event.

Optionally, when the touch position of the first touch event is located is the non-identification region, it is determined whether a second touch event whose touch position is located in the identification region occurs at the same time, the predetermined policy is determined to be a combination policy which combines the first touch event and the second touch event upon the determination that the second touch event is detected at the same time.

Optionally, if the predetermined policy is the combination policy, the process of converting the first touch event into a direction input event includes: generating a combination identifier for the first touch event and the second touch event; and storing the first touch event, the second touch event and the combination identifier, according to the second predetermined format and as the direction input event, into the second preset storage region which is used for storing the direction input event and the control instruction corresponding to the direction input event.

For example, when the first touch event in the non-identification region is detected, the second touch event in the identification region is detected. At the moment, a direction parameter and a pressure parameter are set for the second touch event, a feature parameter (for example, a coordinate parameter or a pressing pressure value) of the first touch event is acquired, a combination identifier used for indicating that the first touch event and the second touch event occur at the same time is set for the first touch event and the second touch event, and the first touch event with the direction parameter and the pressure parameter, the second touch event with the feature parameter, and the combination identifier are converted into the direction input event.

Optionally, when detecting the first touch event executed on the touch screen, whether a third touch event is executed on the touch screen is first detected, where the pressing pressure value of the third touch event is greater than a first predetermined threshold, the pressing pressure value of the first touch event is greater than a second predetermined threshold and the second predetermined threshold is less than the first predetermined threshold. When the third touch event is detected, it is further detected whether there is a first touch event executed on the touch screen.

Optionally, when the third touch event is detected, it is further detected whether there is a first touch event executed on the touch screen within a predetermined time from the time when the third touch event is detected. Alternatively, it is further detected whether there is a first touch event executed on the touch screen in the process that the touch operation is performed on the touch screen from the time when the third touch event is detected.

Optionally, when the touch position of the first touch event is located in the lock screen region, the predetermined policy may be determined by determining whether a fourth touch event is executed in the lock screen region of the touch screen. When the fourth touch event is detected, the number of touch events which have been detected up to now is acquired. When the number of touch events exceeds a first number predetermined threshold, the predetermined policy is set as an exit policy used for indicating not to execute the step of converting the first touch event into a direction input event according to a predetermined policy.

For example, when the position of the first touch event is in the lock screen region, multiple (for example two) touch events are detected in the lock screen region, and then the predetermined policy is determined to be the exit policy used for indicating not to execute the step of converting the first touch event into a direction input event according to a predetermined policy.

To make the description of embodiments of the present disclosure clearer, the following description will be made with reference to an optional embodiment.

In the present optional embodiment, a direction parameter and a pressure parameter of a detected touch event are converted into a direction input event through a suitable policy and the direction input event is stored.

The present optional embodiment provides a method for converting a touch event into the direction input event. The method includes the following steps described below.

In step S1, when a touch screen detection module is in a normal working state, the touch screen detection module detects whether there is a touch event at a fixed sampling frequency, and any touching or pressing operation of a user on the touch screen may be detected. The touch screen detection module converts a position of the captured touch event into a digital signal, generates a notification signal and sends the notification signal to a system processing module.

In step S2, when a pressure detection module is in a normal working state, the pressure detection module detects the touch event at a fixed sampling frequency, and the sampling frequency of the pressure detection module is as same as the sampling frequency of the touch screen detection module. The pressure parameter applied by the user to the touch position is measured by the pressure detection module. The pressure detection module converts the measured pressing pressure value into a digital signal, generates a notification signal and sends the notification signal to the system processing module.

In step S3, the system processing module receives the notification signal generated by the touch screen detection module and the notification signal generated by the pressure detection module, and then acquires the position of the touch event from the touch screen detection module and the pressing pressure value of the touch event the pressure detection module, and records the time when the touch event occurs.

The notification signal is a digital signal which is obtained by further processing the original digital signal includes extra information. The notification signal may include, for example, identity ID information of a surface notification signal or information specifying a correspondence between two digital signals.

In step S4, the position and pressing pressure value are preliminarily converted by the system processing module. The touch position is converted into a screen coordinate and the pressing pressure value is compared with threshold values P0 and P1, where P0<P1. If the pressing pressure value is less than P0, the touch event is marked with an identity "tap". If the pressing pressure value is greater than P0, the pressing pressure value is compared with P1. If the pressing pressure value is greater than P1, the touch event is marked with an identity "press", and if the pressing pressure value is greater than or equal to P0 and less than or equal to P1, the touch event is marked with an identity "screen touch".

In step S5, the touch event marked with the identity "tap" is directly placed into a system massage pool by the system processing module. If the touch event marked with the identity "press" exists, step S7 is performed.

In step S6, the touch event marked with the identity "tap" which is directly placed into the system massage pool is directly acquired and used by application program, and represents a tap operation in common touch operations. For example, a bottom or a list item is tapped so as to execute the normal touch screen input operation.

In step S7, the system processing module retains the touch event marked with the identity "press", and records parameters of the touch event, such as a touch position, a pressing pressure value and a touch time. The system processing module sets an input state machine to an simulation direction input state, and starts the timer, where a duration T0 of the timer is greater than a total time length of C0 sampling periods.

In step S8, in the simulation direction input state, the system processing module respectively processes every touch event sampled later according to a pressing force identity of the every touch event. The touch event marked with the identity "tap" is directly discarded, and the touch event except the touch event marked with the identity "tap" is converted into the direction input event.

Figure 2:
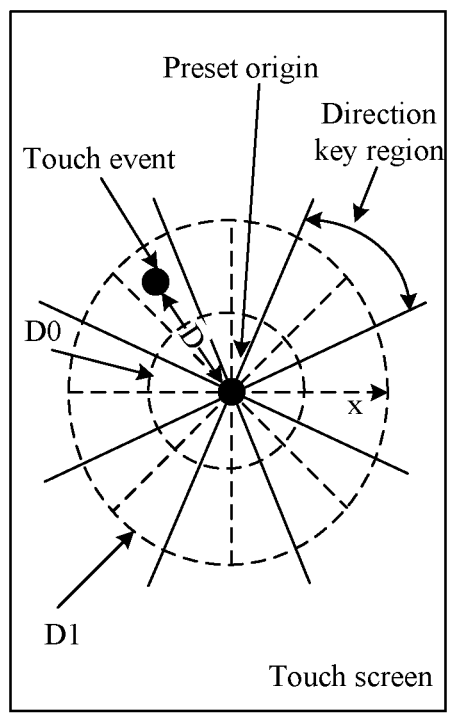
FIG. 2 is a schematic diagram of a touch event according to an embodiment of the present disclosure.

In step S9, the direction parameter is set for the touch event according to the direction policy. FIG. 2 is a schematic diagram of a touch event according to an embodiment of the present disclosure. As shown in FIG. 2, the distance from the touch event to the preset origin is D, and D is compared with D0 and D1, where D0 and D1 are preset thresholds and D0<D1. If D0<D<D1, the touch event is located in the identification region and then is converted into the direction input event according to the predetermined policy. If D<D0, the touch event is located in the lock screen region and then step S14 is performed. If D>D1, the touch event is located in the non-identification region. If no touch event exists in the identification region at the same time, the touch event in the non-identification region is discarded; and if there exists a touch event in the identification region at the same time, the touch event is converted into the direction input event according to a combination policy and the direction input event is placed into the system massage pool.

One direction policy is that: the touch screen is divided into 8 regions based on a coordinate system with the above preset origin, where the 8 regions correspond to 8 direction keys and are represented by regions between solid lines in the FIG. 2 respectively. When a ratio of the Y coordinate to the X coordinate of the touch position of the touch event is greater than a lower limit slope of one section and less than an upper limit slope of the one section, the touch event is determined to be in the one section and a corresponding direction parameter is set for the touch event.

Another direction policy is that: a phase parameter as the direction parameter is added for the touch event according to a phase policy. A phase parameter conversion policy is to use a ratio of an X-axis offset value X0 of the position coordinate of the touch event relative to the preset origin to the distance from the position of the touch event to the preset origin as the phase parameter.

In step S10, the pressure parameter is set for the touch event according to the pressure policy. A pressure parameter conversion policy is that the pressure parameter is acquired by dividing the pressing pressure value of the touch event by a predetermined pressure. That is, a percentage parameter of an input pressure relative to a standard pressure is used as the pressure parameter.

In step S11, after the above parameters are acquired, the touch event is converted into the direction input event according to the acquired parameters, and basic parameters in the direction input event include the direction parameter, pressure parameter, coordinate of the touch event and pressure value of the touch event. Correspondingly, touch events are acquired through continuous sampling by repeating steps from S5 to S11, so that multiple direction input events are generated.

In step S12, the application software gets the direction input event from the system massage pool, executes a corresponding direction control operation and determines a manner of executing the direction control operation according to the direction parameter and pressure parameter carried by the direction input event or a combination event. An application behavior may be defined by the application software, and different application software may set different definitions for the direction input event.

In step S13, when no convertible touch event input is detected by the system processing module within the duration T0 of the timer which is started in step S7, it is determined that the simulation input state ends.

In step S14, as a supplement to the conversion to the simulation direction input state in the step S7, if in the duration T0, the system processing module detects a pressing operation in the lock screen region again within a range in which the distance from the preset origin is less than D0, that is, a double-click pressing is detected, the system processing module sets the input state machine to the locked state.

In step S15, in the locked state, the detection in the time period T0 for determining whether to exit the simulation direction input state is not executed. That is, in the locked state, the simulation direction input state may be maintained without the need to continuously touch the identification region, and any touch on the identification region at any time may be converted into the direction input event. Any tap operation with a pressing pressure value less than P0 may also be correspondingly converted into the direction input event.

In step S16, in the locked state, the locked state and the simulation direction input state are quitted by pressing the lock screen region and repeating the pressing operation within the duration T0.

It is to be noted that the above-mentioned preset threshold values may be any meaningful values, which doesn't affect the implementation of the present optional embodiment. For example, if D1 is a value greater than the size of the screen, there is no non-identification region in this optional embodiment, but the function implementation of the present optional embodiment will not be affected. In another example, if the duration T0 is long enough, continuous touches are not necessary in the lock operation.

The above-mentioned optional embodiment is described by taking the scenario of inputting a text as an example. In the process of inputting text, a symbol "( )" is inserted and then data needs to be inserted into the symbol "( )", a pressure greater than P1 is applied to the screen, and the system processing module identifies a pressed reference point and starts the T0 timer. If a pressure not less than P2 is applied to the identification region on the left side of the reference point within the time period T0, the system processing module converts this pressing into an input of moving left, a corresponding input cursor moves into the symbol "( )" and words may be inputted immediately.

Optionally, a finger presses the screen with a pressure greater than P1 and then the finger is kept in tapping with the screen, the system pressing module will not exit the simulation direction input state, and the input of moving left may be implemented by merely sliding to the identification region on the left side of the reference point and pressing the screen with the pressure greater than P2.

Optionally, the input state machine in kept in the locked state by continuously pressing the screen twice with the pressure greater than P1 locked state, the cursor is moved into the symbol "( )" by pressing the identification region on the left with the pressure greater than P2, and then the locked state is exited and the user proceeds to input words.

In another scenario where a large number of words previously inputted need to be modified, a direction input event may be executed to move the cursor. Taking the direction inputting in a non-locked state as an example, the direction inputting in the locked state is similar and will not be repeated herein. If the non-identification region is touched at the same time, the system processing module converts this operation into the direction input event according to the combination policy and stores the direction input event in the system massage pool. The text input application may identify that this is a selection operation, that is, highlight corresponding words. In addition, when the identification region is pressed with a pressure greater than the preset value P2, the system processing module converts this operation into a direction input event with a high pressure coefficient. The text input application receives this high pressure parameter fp (assuming fp>1), that is, performs an action of selecting a whole line of words, and selects multiple words at one time.

From the description of the embodiments described above, it will be apparent to those skilled in the art that the method of any embodiment described above may be implemented by means of software plus a general-purpose hardware platform, or may of course be implemented by hardware. The solution provided by the present disclosure may be embodied in the form of a software product. The computer software product is stored in a storage medium (such as a ROM/RAM, a magnetic disk or an optical disk) and the storage medium includes several instructions for enabling a terminal device (which may be a mobile phone, a computer, a server, a network device, or the like) to execute the method according to the embodiments of the present disclosure.

Second Embodiment

Figure 3:
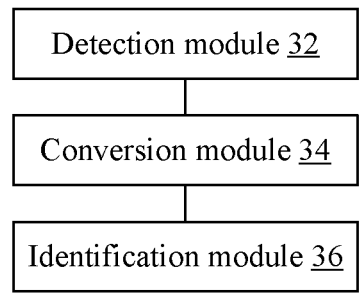
FIG. 3 is a first block diagram of an optional control instruction identification apparatus according to an embodiment of the present disclosure.

The present disclosure further provides a control instruction identification apparatus. The apparatus is used for implementing the above-mentioned embodiments and preferred embodiments, and those that have been described will not be repeated. As used below, a term "module" may be software, hardware or a combination thereof capable of implementing predetermined functions. FIG. 3 is a first block diagram of an optional control instruction identification apparatus according to an embodiment of the present disclosure. As shown in FIG. 3, the apparatus includes:

a detection module 32, which is configured to detect a first touch event executed on a touch screen, where the first touch event is used for indicating a touch position and a pressing pressure value when a touch operation is performed on the touch screen;

a conversion module 34, which is coupled to the detection module 32 and configured to convert the first touch event into a direction input event according to a predetermined policy; and an identification module 36, which is coupled to the conversion module 34 and configured to identify a control instruction according to the direction input event, where the control instruction corresponds to the first touch event and is to be executed on the touch screen.

Optionally, the present embodiment may, but is not limited to, be applied to a scenario of identifying the control instruction on the touch screen, especially in a scenario in which the control instruction on the touch screen of a terminal is identified with combination of operation directions on a touch control screen of the touch screen, such as the movement of a text input position in a text input scenario, the control of the way, number and position of selection in a text selection scenario, the direction control of an operation target in a game scenario and the control of the current display content in a web browsing scenario.

The touch position and the pressing pressure value of the first touch event detected by the detection module 32 are converted by the conversion module 34 into the direction input event according to the predetermined policy, and the corresponding control instruction for controlling the touch screen is identified by the identification module 36 according to the direction input event. Different control instructions are set for the direction input event according to different usage scenarios in advance, so that when the direction input event is received again, the corresponding control instruction is identified according to different scenarios. The combination of the touch position and the pressing pressure value may also provide more manners of identifying the control instruction, so that operations on the touch screen may identify more user intents, thereby implementing the identification of the control instruction on the touch screen according to the touch position and the pressing pressure value, strengthening the identification of user control intents on the touch screen and enriching the manner of identifying the control instruction on the touch screen.

Figure 4:
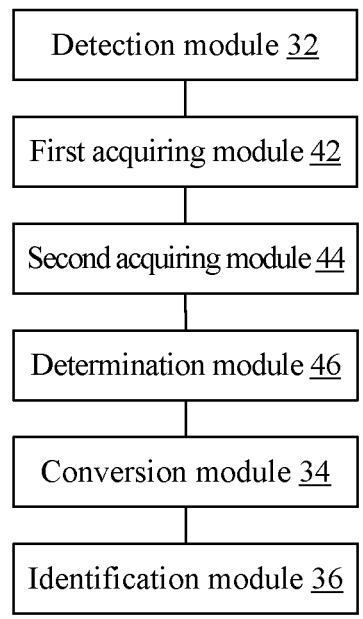
FIG. 4 is a second block diagram of an optional control instruction identification apparatus according to an embodiment of the present disclosure.

FIG. 4 is a second block diagram of an optional control instruction identification apparatus according to an embodiment of the present disclosure. As shown in FIG. 4, the apparatus includes:

a first acquiring module 42, which is coupled to the detection module 32 and configured to acquire a positional relationship between the touch position of the first touch event and a preset origin;

a second acquiring module 44, which is coupled to the first acquiring module 42 and configured to acquire a region in which the touch position of the first touch event is, where the region includes at least one of: an identification region, a non-identification region and a lock screen region; and a determination module 46, which is coupled between the second acquiring module 44 and the conversion module 34 and configured to determine a predetermined policy according to the positional relationship and the region.

Optionally, the predetermined policy may be determined according to features of the first touch event by the determination module 46. More manners are provided for the generation of the direction input event by setting different predetermined policies for different features of the first touch event, so as to provide more control instructions for the touch operation of a user, thereby identifying more control intents on the touch screen.

An example is described below to illustrate the process that the determination module 46 determines the corresponding predetermined policy according to the features of the first touch event.

In the present example, before the conversion module 34, a preset origin on the screen may be set by the determination module 46, the screen is divided into multiple regions according to a certain rule with the preset origin as a center, and the predetermined policy is determined according to the positional relationship between the first touch event and the preset origin as well as the region of the screen in which the first touch event is located. By determining the policy for converting the first touch event into the direction input event according to different regions, the manners of identifying the control instruction are increased, the identification of the control intention by the touch screen is enhanced, the manner of identifying the control instruction on the touch screen is enriched, and the user experience is improved.

In the present embodiment, the touch screen may be divided into the following regions: an identification region, a non-identification region and a lock screen region. It is to be noted that the above-mentioned three regions are merely examples to illustrate the present disclosure and are not intended to limit the region division manner of the touch screen for determining the predetermined policy.

Three examples are described below to respectively illustrate the manner that the determination module 46 determines the predetermined policy when the touch position of the first touch event is located in the three different regions.

In the first example, described is a process of determining the predetermined policy when the region in which the touch position of the first touch event is located is the identification region.

When the region in which the touch position of the first touch event is located is the identification region, the determination module 46 determines the predetermined policy to be a default policy, where the default policy may include a direction policy used for setting a direction parameter for the first touch event and/or a pressure policy used for setting a pressure parameter for the first touch event. It is to be noted that the default policy includes, but is not limited to, the direction policy and the pressure policy. The default policy may also be a policy which is used for setting other parameters of the first touch event. The embodiments of the present disclosure merely take the direction policy and the pressure policy as an example.

In the first example, after the determination module 46 determines the predetermined policy to be the default policy, the conversion module 34 sets the direction parameter for the first touch event according to the direction policy, sets the pressure parameter for the first touch event according to the pressure policy, and converts the first touch event into the direction input event according to the direction parameter and the pressure parameter.

When the direction parameter is set for the first touch event according to the direction policy, the conversion module 34 first acquires a direction of the touch position relative to the preset origin, and then sets a direction indication parameter corresponding to the direction as the direction parameter of the first touch event.

In the first example, the direction indication parameter may be a slope of the touch position relative to the preset origin, or an included angle between an X-axis and a line connecting the touch position and the preset origin, or a preset direction parameter. The pressure parameter may be a ratio of the pressing pressure value of the first touch event to a preset pressure value. The pressure parameter is used for representing a range of and degree of a control operation executed according to the control instruction.

After the direction parameter and the pressure parameter are acquired for the first touch event according to the default policy, the conversion module 34 stores the direction parameter and the pressure parameter as the direction input event into a first preset storage region according to a first predetermined format. The first preset storage region is used for storing the direction input event and the control instruction corresponding to the direction input event. That is, the direction parameter and the pressure parameter of the first touch event as the direction input event, as well as the control instruction corresponding to these two parameters, are stored into a designated storage region for use by an application program.

With the above-mentioned apparatus, when the first touch event is located in the identification region, the conversion module 34 sets the direction parameter and the pressure parameter for the first touch event according to the positional relationship between the first touch event and the preset origin and stores the direction parameter and the pressure parameter of the first touch event as the direction input event into the first preset storage region according to the first preset format. The application program may use the direction input event, and acquire a control instruction corresponding to the direction input event in the application program according to the direction parameter and the pressure parameter, so as to control the touch screen. It can be seen that with the above-mentioned apparatus, the control instruction may be set for the direction input event according to requirements of different applications, and in addition, the forms of setting and using the control instruction may also be enriched with the combination of the direction parameter and the pressure parameter.

In the second example, described is a process of determining the predetermined policy when the region in which the touch position of the first touch event is located is the non-identification region.

In the second example, when the region in which the touch position of the first touch event is located is the non-identification region, the determination module 46 determines whether a second touch event whose touch region is located in the identification region is detected at the same time. If the second touch event is detected at the same time, the determination module 46 determines the predetermined policy to be a combination policy which combines the first touch event and the second touch event. In the combination policy, the conversion module 34 first generates a combination identifier for the first touch event and the second touch event to indicate a relationship between the first touch event and the second touch event, for example, the combination identifier may be used for indicating that the first touch event and the second touch event are detected simultaneously, and then stores the first touch event, the second touch event and the combination identifier, according to a second predetermined format and as the direction input event, into a second preset storage region which is used for storing the direction input event and the control instruction corresponding to the direction input event.

Through the above-mentioned apparatus, when the detection module 32 detects touch events in both the identification region and the non-identification region at the same time, the first touch event occurring in the non-identification region is retained, and the determination module 46 determines the predetermined policy to be the combination policy. The conversion module 34 creates a relationship between the first touch event and the second touch event occurring in the identification region and converts the two touch events into the direction input event. When the application is used according to the direction input event, the direction of the screen may be controlled according to the touch event in the identification region, other instructions may be executed according to the touch event in the identification region, and touch event in the non-identification region which may be discarded in the related art may be used in the present disclosure, so that control intents expressed through the touch screen are enriched and more manners of identifying the control instruction are provided.

In addition, the detection module 32 first detects whether a third touch event whose pressing pressure value is greater than a first predetermined threshold is executed on the touch screen. When the third touch event is detected, the detection module 32 detects whether there exists the first touch event executed on the touch screen. In the present embodiment, the pressing pressure value of the third touch event is greater than the first predetermined threshold, the pressing pressure value of the first touch event is greater than a second predetermined threshold, and the first predetermined threshold is greater than the second predetermined threshold. That is, after the third touch screen whose pressing pressure value is greater than a relatively large threshold is detected, the requirement of the pressing pressure value of the first touch event may be decreased to be a relatively small threshold. In such way, more touch events may be identified as the first touch event and converted into the direction input event, so that convertible user operations are increased and the manner of identifying the control instruction on the touch screen is enriched.

In the present embodiment, the preset origin may be set in advance, or acquired by identifying a touch operation, for example, the third touch event may be identified as setting the origin.

When the third touch event is detected by the detection module 32, the time for detecting the first touch event after the detection of the third touch event may be limited by setting a timer. That is, it is detected whether the first touch event is executed on the touch screen within a predetermined period from the detection of the third touch event; or whether to detect the first touch event may be determined by detecting whether continuous touch operations on the touch screen exist. For example, during the process that the third touch event is detected and the corresponding touch operation is performed on the touch screen, whether the first touch event executed on the touch screen exists is detected. Through the above-mentioned apparatus, a limit condition may be added for the first touch event, so that the manner for identifying the control instruction is enriched.

In the third example, described is a process of determining the predetermined policy when the touch position of the first touch event is located in the lock screen region.

In the third example, when the region in which the touch position of the first touch event is located is the lock screen region, the determination module 46 detects whether a fourth touch event is executed in the lock screen region of the touch screen. The determination module 46 acquires the number of touch events currently detected when the fourth touch event is detected. When the number of touch events exceeds a first number predetermined threshold, the determination module 46 sets the predetermined policy as an exit policy configured to indicate not to execute the step of converting the first touch event into a direction input event according to the predetermined policy.

In the present embodiment, a system state before the first touch event is detected by the detection module 32 may be defined as a simulation input state. When the system is in the simulation input state, the detected first touch event is converted into the direction input event corresponding to the control instruction according to the predetermined policy. In order to keep the system in the simulation input state, a timer may be set and the first touch event detected within a specified period of the timer is used for the identification of the control instruction, or the touch operation on the touch screen may be maintained and the first touch event whose pressing pressure value satisfy a condition in the process of the touch operation is used for the identification of the control instruction.

In addition, when the first touch event is located in the lock screen region, the system is locked in the simulation input state, that is, the system is unconditionally kept in the simulation input state, and such state of the system is defined as the lock screen state. The lock screen state and/or the simulation input state may be exited through trigging a preset number of touch events in the lock screen region.

Optionally, the determination module 46 is configured to: when the region in which the touch position of the first touch event is located is the identification region, determine the predetermined policy to be the default policy. The default policy includes the direction policy and/or the pressure policy, the direction policy is used for setting the direction parameter for the first touch event and the pressure policy is used for setting the pressure parameter for the first touch event.

Optionally, the conversion module 34 is configured to: set the direction parameter for the first touch event according to the direction policy, set the pressure parameter for the first touch event according to the pressure policy, and convert the first touch event into the direction input event according to the direction parameter and the pressure parameter.

Optionally, the conversion module 34 is further configured to: acquire a direction of the touch position relative to the preset origin, and set the direction indication parameter corresponding to the direction as the direction parameter of the first touch event. The direction indication parameter includes at least one of: a slope of the touch position relative to the preset origin, an included angle between the X-axis and a line connecting the touch position and the preset origin, or a preset direction parameter.

Optionally, the conversion module 34 is further configured to acquire a ratio of the pressing pressure value of the first touch event to the preset pressure value.

Optionally, the conversion module 34 is further configured to: store the direction parameter and the pressure parameter as the direction input event into the first preset storage region according to the first predetermined format, where the first preset storage region is used for storing the direction input event and the control instruction corresponding to the direction input event.

Optionally, the determination module 46 is configured to: when the region in which the touch position of the first touch event is located is the non-identification region, determine whether the second touch event is detected at the same time, where the touch position of the second touch event is located in the identification region; and when determining that the second touch event is detected at the same time, determine the predetermined policy to be the combination policy, where the combination policy is used for combining the first touch event and the second touch event.

Optionally, the conversion module 34 is further configured to: generate the combination identifier for the first touch event and the second touch event, and take the first touch event, the second touch event and the combination identifier as the direction input event and store it into the second preset storage region according to the second predetermined format, where the second preset storage region is used for storing the direction input event and the control instruction corresponding to the direction input event.

Optionally, the detection module 32 is configured to detect whether the third touch event is executed on the touch screen. The pressing pressure value of the third touch event is greater than the first predetermined threshold, the pressing pressure value of the first touch event is greater than the second predetermined threshold and the second predetermined threshold is less than the first predetermined threshold. The detection module 32 is further configured to detect whether the first touch event is executed on the touch screen when the third touch event is detected.

Optionally, the detection module 32 is configured to: detect whether the first touch event is executed on the touch screen within the predetermined period from the time when the third touch event is detected; or detect whether the first touch event is executed on the touch screen during the process that the touch operation is performed on the touch screen from the time when the third touch event is detected.

Optionally, the determination module 46 is configured to: determine whether the fourth touch event is executed on the touch screen in the lock screen region when the region in which the touch position of the first touch event is located is the lock screen region; acquire the number of touch events detected when the fourth touch event is detected; and sets the predetermined policy as the exit policy when the number of touch events exceeds the first number predetermined threshold. The exit policy is used for indicating not to execute the step of converting the first touch event into a direction input event according to a predetermined policy.

To make the description of embodiments of the present disclosure clearer, the following description will be made with reference to an optional embodiment.

Figure 5:
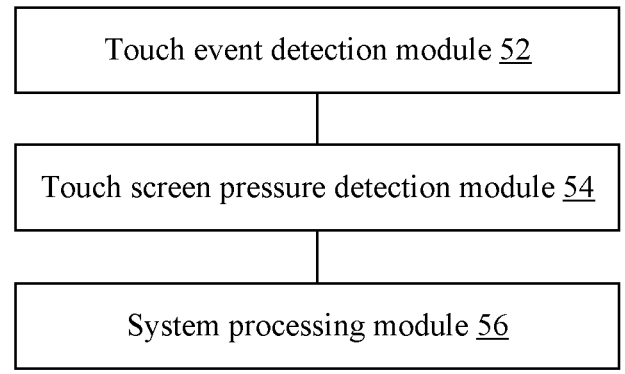
FIG. 5 is a block diagram of a direction input simulation apparatus according to an embodiment of the present disclosure.

FIG. 5 is a block diagram of an simulation direction input apparatus according to an embodiment of the present disclosure. As shown in FIG. 5, the apparatus includes:

1) a touch event detection module 52, which is configured to detect an application interaction executed on a touch screen of a mobile terminal, input a touch event to the touch screen of the mobile terminal, and detect a coordinate parameter of the touch event;

2) a touch screen pressure detection module 54 coupled to the touch event detecting module 52, which is configured to detect a pressure parameter generated in a touch position; and 3) a system processing module 56 coupled to the touch screen pressure detection module 54, which is configured to capture the touch event, obtain a policy matching the touch event, convert the touch event into a direction input event, and place the direction input event into a system massage pool.

Application software gets the direction input event from the massage pool and executes corresponding operations to present appropriate interaction behaviors on the touch screen, such as scrolling, linefeed, page turning, focus switching and the like.

It is to be noted that the various modules described above may be implemented by software or hardware. Implementation by hardware may, but may not necessarily, be performed by the following method: the various modules described above are located in a same processor or the various modules described above are located in multiple processors respectively.

Third Embodiment

An embodiment of the present disclosure further provides a storage medium. In the present embodiment, the storage medium may be configured to store program codes for executing the steps described below.

In step S1, a first touch event executed on a touch screen is detected. The first touch event is used for indicating a touch position and a pressing pressure value when a touch operation is performed on the touch screen.

In step S2, the first touch event is converted into a direction input event according to a predetermined policy.

In step S3, a control instruction is identified according to the direction input event. The control instruction corresponds to the first touch event and is to be executed on the touch screen Optionally, in the present embodiment, the storage medium may, but is not limited to, include a U disk, a read-only memory (ROM), a random access memory (RAM), a mobile hard disk, a magnetic disk, an optical disk or another medium capable of storing program codes.

Those skilled in the art should know that the above-mentioned modules or steps of the present disclosure may be implemented by a universal computing device, where they may be concentrated on a single computing device or distributed on a network composed of a plurality of computing devices, and alternatively, they may be implemented by program codes executable by the computing devices, so that they may be stored in a storage device to be executed by the computing devices and the shown or described steps may be executed in sequences different from the sequences described herein, or they may be made into a plurality of integrated circuit modules separately, or a plurality of modules or steps therein may be made into a single integrated circuit module for implementation.

The present disclosure further provides a device. The device includes:
one or more processors 62;
a memory 64; and
one or more programs stored in the memory, where when executed by the one or more processors, the one or more programs, execute operations of any one of the above-mentioned control instruction identification methods.

Figure 6:
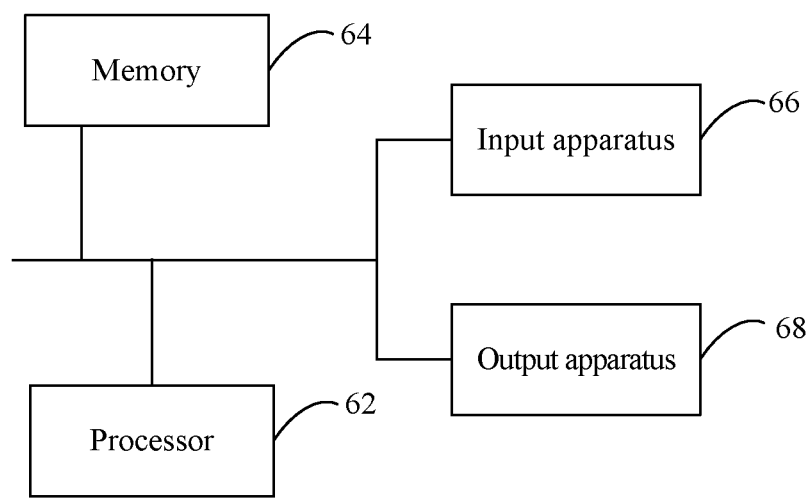
FIG. 6 is a hardware structural diagram of a device for executing the control instruction identification method according to an embodiment of the present disclosure.

The present disclosure further provides a hardware structural diagram of a device to execute the control instruction identification method. With reference to FIG. 6, the device includes:
one or more processors 62, where FIG. 3 uses one processor 62 as an example; and
a memory 64.

The device further includes an input apparatus 66 and an output apparatus 68. The processor 62, the memory 64, the input apparatus 66 and the output apparatus 68 in the device may be connected via a bus or other means, with connection via a bus as an example in FIG. 6.

As a non-volatile storage medium, the memory 64 is used for storing software programs and computer-executable programs, such as program instructions or modules corresponding to the method for identifying the control instruction in embodiments of the present disclosure. The processor 62 runs the software programs, instructions and modules stored in the memory 64 to perform function applications and data processing of a server, that is, implement the control instruction identification method in the above-mentioned embodiments of the present disclosure.

The memory 64 may include a program storage region and a data storage region, where the program storage region may store an operating system and an application program required by at least one function while the data storage region may store data created in use of a terminal device. In addition, the memory 64 may include a high-speed random access memory, and may also include a non-volatile memory such as at least one disk memory, flash memory or other non-volatile solid state memories. In some examples, the memory 64 may include memories which are remotely disposed relative to the processor 62 and these remote memories may be connected to the terminal via a network. Examples of such networks include, but are not limited to, the Internet, intranets, local area networks, mobile communication networks, and combinations thereof.

The input apparatus 66 may be configured to receive inputted digital or character information and generate key signal input related to user settings and function control of the terminal. The output device 66 may include a display screen and other display devices.

When executed by the one or more processors 62, the one or more modules, which are stored in the memory 64, execute operations in the above-mentioned control instruction identification method.

INDUSTRIAL APPLICABILITY

With the control instruction identification method and apparatus and the storage medium provided by the embodiments of the present disclosure, more manners of identifying the control instruction are provided, so that more user intents may be identified by using the control instruction on a touch screen, the identification of the control instruction on the touch screen according to a touch position and a pressing pressure value is implemented, and the manner of identifying the control instruction on the touch screen is enriched.

What is claimed is:
1. A control instruction identification method, comprising:
detecting a first touch event executed on a touch screen, wherein the first touch event is used for indicating a touch position and a pressing pressure value when a touch operation is performed on the touch screen;
converting the first touch event into a direction input event according to a policy; and identifying a control instruction corresponding to the first touch event according to the direction input event, wherein the control instruction is to be executed on the touch screen;

before the converting the first touch event into a direction input event according to a policy, further comprising:

acquiring a positional relationship between the touch position of the first touch event and a preset origin position;

acquiring a region in which the touch position of the first touch event is located, wherein the region comprises at least one of: an identification region, a non-identification region or a lock screen region; and determining the policy according to the positional relationship and the region;

wherein the determining the policy according to the positional relationship and the region comprises:

when the region in which the touch position of the first touch event is located is the non-identification region, determining whether a second touch event is detected simultaneously with the first touch event, wherein a touch position of the second touch event is located in the identification region; and when determining that the second touch event is detected simultaneously with the first touch event, determining the policy to be a combination policy, wherein the combination policy is used for combining the first touch event and the second touch event.

2. The method according to claim 1, wherein the determining the policy according to the positional relationship and the region comprises:

when the region in which the touch position of the first touch event is located is the identification region, determining the policy to be a default policy, wherein the default policy comprises a direction policy and/or a pressure policy, wherein the direction policy is used for setting a direction parameter for the first touch event and the pressure policy is used for setting a pressure parameter for the first touch event.

3. The method according to claim 2, the converting the first touch event into a direction input event according to a policy comprises:

setting the direction parameter for the first touch event according to the direction policy;

setting the pressure parameter for the first touch event according to the pressure policy; and converting the first touch event into the direction input event according to the direction parameter and the pressure parameter.

4. The method according to claim 3, the setting the direction parameter for the first touch event according to the direction policy comprises:

acquiring a direction of the touch position relative to the preset origin position; and setting a direction indication parameter corresponding to the direction as the direction parameter of the first touch event, wherein the direction indication parameter comprises at least one of: a slope of the touch position relative to the preset origin position, or an included angle between an X-axis direction and a line connecting the touch position.

5. The method according to claim 3, wherein the setting the pressure parameter for the first touch event according to the pressure policy comprises:

acquiring a ratio of the pressing pressure value of the first touch event to a preset pressure value; and setting the ratio as the pressure parameter.

6. The method according to claim 3, wherein the converting the first touch event into the direction input event according to the direction parameter and the pressure parameter comprises:

storing the direction parameter and the pressure parameter as the direction input event into a first preset storage region according to a first predetermined format, wherein the first preset storage region is used for storing the direction input event and the control instruction corresponding to the direction input event.

7. The method according to claim 1, wherein the converting the first touch event into a direction input event according to a policy comprises:

generating a combination identifier for the first touch event and the second touch event; and storing the first touch event, the second touch event and the combination identifier as the direction input event into a second preset storage region according to a second predetermined format, wherein the second preset storage region is used for storing the direction input event and the control instruction corresponding to the direction input event.

8. The method according to claim 1, wherein the detecting a first touch event executed on a touch screen comprises:

detecting whether a third touch event is executed on the touch screen, wherein a pressing pressure value of the third touch event is greater than a first predetermined threshold, the pressing pressure value of the first touch event is greater than a second predetermined threshold, and the second predetermined threshold is less than the first predetermined threshold; and in response to the detection of the third touch event, detecting the first touch event executed on the touch screen.

9. The method according to claim 8, wherein in response to the detection of the third touch event, the detecting the first touch event executed on the touch screen comprises:

within a predetermined period of time from when the third touch event is detected, detecting the first touch event executed on the touch screen; or during a process of executing a touch operation on the touch screen in response to the third touch event being detected, detecting the first touch event executed on the touch screen.

10. The method according to claim 1, wherein the determining the policy according to the positional relationship and the region comprises:

when the region in which the touch position of the first touch event is located is the lock screen region, detecting whether a fourth touch event is executed on the touch screen in the lock screen region;

in response to the detection of the fourth touch event, acquiring a current number of detected touch events; and when the number of touch events exceeds a first predetermined number threshold, setting the policy as an exit policy, wherein the exit policy is used for indicating not to execute the step of converting the first touch event into a direction input event according to a policy.

11. A non-transitory storage medium storing computer-executable instructions for executing a control instruction identification method, wherein the control instruction identification method comprises:

detecting a first touch event executed on a touch screen, wherein the first touch event is used for indicating a touch position and a pressing pressure value when a touch operation is performed on the touch screen;

converting the first touch event into a direction input event according to a policy; and
identifying a control instruction corresponding to the first touch event according to the direction input event, wherein the control instruction is to be executed on the touch screen;
before the converting the first touch event into a direction input event according to a policy, the method further comprises:
acquiring a positional relationship between the touch position of the first touch event and a preset origin position;
acquiring a region in which the touch position of the first touch event is located, wherein the region comprises at least one of: an identification region, a non-identification region or a lock screen region; and
determining the policy according to the positional relationship and the region;
wherein the determining the policy according to the positional relationship and the region comprises:
when the region in which the touch position of the first touch event is located is the non-identification region, determining whether a second touch event is detected simultaneously with the first touch event, wherein a touch position of the second touch event is located in the identification region; and
when determining that the second touch event is detected simultaneously with the first touch event, determining the policy to be a combination policy, wherein the combination policy is used for combining the first touch event and the second touch event.

12. The non-transitory storage medium according to claim 11, wherein the determining the policy according to the positional relationship and the region comprises:
when the region in which the touch position of the first touch event is located is the identification region, determining the policy to be a default policy, wherein the default policy comprises a direction policy and/or a pressure policy, wherein the direction policy is used for setting a direction parameter for the first touch event and the pressure policy is used for setting a pressure parameter for the first touch event.

13. The non-transitory storage medium according to claim 12, wherein the converting the first touch event into a direction input event according to a policy comprises:
setting the direction parameter for the first touch event according to the direction policy;
setting the pressure parameter for the first touch event according to the pressure policy; and
converting the first touch event into the direction input event according to the direction parameter and the pressure parameter.

14. A control instruction identification device, comprises:
one or more processors;
a memory; and
one or more programs stored in the memory, wherein when executed by the one or more processors, the one or more programs execute a control instruction identification method,
wherein the control instruction identification method comprises:
detecting a first touch event executed on a touch screen, wherein the first touch event is used for indicating a touch position and a pressing pressure value when a touch operation is performed on the touch screen;
converting the first touch event into a direction input event according to a policy; and
identifying a control instruction corresponding to the first touch event according to the direction input event, wherein the control instruction is to be executed on the touch screen;
before the converting the first touch event into a direction input event according to a policy, the method further comprises:
acquiring a positional relationship between the touch position of the first touch event and a preset origin position;
acquiring a region in which the touch position of the first touch event is located, wherein the region comprises at least one of: an identification region, a non-identification region or a lock screen region; and
determining the policy according to the positional relationship and the region;
wherein the determining the policy according to the positional relationship and the region comprises:
when the region in which the touch position of the first touch event is located is the non-identification region, determining whether a second touch event is detected simultaneously with the first touch event, wherein a touch position of the second touch event is located in the identification region; and
when determining that the second touch event is detected simultaneously with the first touch event, determining the policy to be a combination policy, wherein the combination policy is used for combining the first touch event and the second touch event.

15. The control instruction identification device according to claim 14, wherein the determining the policy according to the positional relationship and the region comprises:
when the region in which the touch position of the first touch event is located is the identification region, determining the policy to be a default policy, wherein the default policy comprises a direction policy and/or a pressure policy, wherein the direction policy is used for setting a direction parameter for the first touch event and the pressure policy is used for setting a pressure parameter for the first touch event.

16. The control instruction identification device according to claim 15, wherein the converting the first touch event into a direction input event according to a policy comprises:
setting the direction parameter for the first touch event according to the direction policy;
setting the pressure parameter for the first touch event according to the pressure policy; and
converting the first touch event into the direction input event according to the direction parameter and the pressure parameter.

* * * * *